United States Patent [19]

Machala, III et al.

[11] Patent Number: 5,257,200

[45] Date of Patent: Oct. 26, 1993

[54] OPTIMIZATION SYSTEM

[75] Inventors: Charles F. Machala, III; James E. Flowers, both of Dallas, Tex.

[73] Assignee: Texas Instruments Incorporated, Dallas, Tex.

[21] Appl. No.: 988,385

[22] Filed: Dec. 8, 1992

Related U.S. Application Data

[63] Continuation of Ser. No. 632,288, Dec. 21, 1990, abandoned.

[51] Int. Cl.$^5$ ............................................. G06F 15/20
[52] U.S. Cl. ................................... 364/488; 364/578
[58] Field of Search ................................ 364/488, 578

[56] References Cited

U.S. PATENT DOCUMENTS 4,678,947 7/1987 Huijsing et al. ..................... 307/490
4,962,321 10/1990 Hansen, Jr. ......................... 307/301

*Primary Examiner*—Edward R. Cosimano
*Attorney, Agent, or Firm*—Stanton C. Braden; Richard L. Donaldson; William E. Hiller

[57] ABSTRACT

A modeling system 10 comprises a central processing unit 12 coupled to an arithmetic logic unit 16. A device testing system 18 is used to empirically analyze the operational characteristics of a transistor to be modeled by the system 10. A set of parameter values are stored in a memory circuit 14 coupled to central processing unit 12. An input and display system 20 is used to interact with the central processing unit 12. The central processing unit 12 uses the arithmetic logic unit 16 to calculate an objective function which is essentially a measure of the error between the measured values of operating variables of the device to be modeled and theoretical values of the operating variables calculated using initial guesses of modeling parameters. The objective function is minimized by calculating the gradient of the objection function to obtain a next guess point with its associated parameter values. If one of the parameter values for the next guess point violates a constraint on that parameter value, the gradient of the objective function is recalculated ignoring the particular parameter. The multiple iterations associated with the "hem-stitching" operations common with prior art systems are thus avoided.

10 Claims, 2 Drawing Sheets

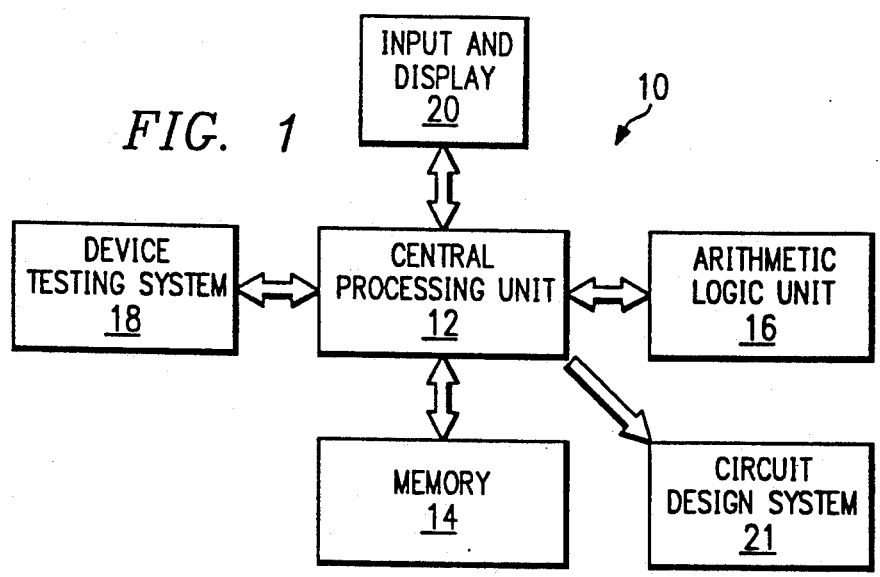
*FIG. 1*
$$OBJ = \sum_{i=1}^{N} \frac{(D1_{m_i} - D1_{c_i})^2}{D1_{m_i}^2} + \frac{(D2_{m_i} - D2_{c_i})^2}{D2_{m_i}^2} + \cdots + \frac{(DN_{m_i} - DN_{c_i})^2}{DN_{m_i}^2}$$
*FIG. 2*
*(PRIOR ART)*
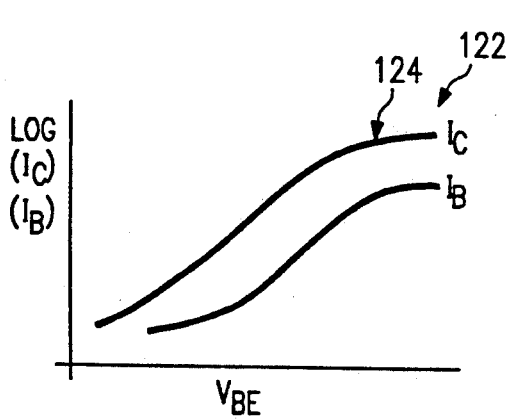
*FIG. 3a*
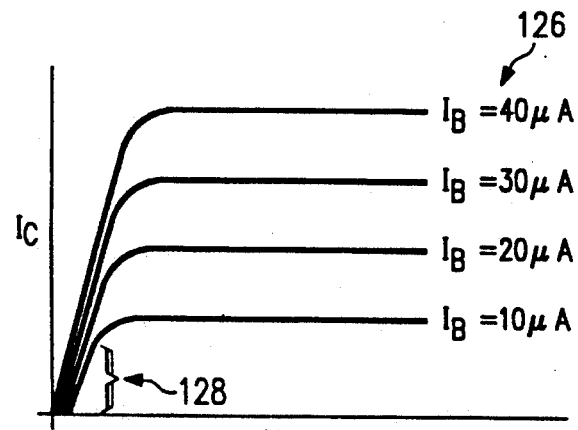
*FIG. 3b*

$$OBJ = \sum_{i=1}^{N} \frac{\frac{(I_{cm_i} - I_{cc_i})^2}{I_{cm_i}^2}}{\frac{(I_{cm_{1_T}} - I_{cc_{1_T}}^2)}{I_{cm_{1_T}}^2}} + \frac{(I_{c_{m_i}} - I_{c_{c_i}})^2}{(I_{c_{m_{1_T}}} - I_{c_{c_{1_T}}}^2)} + \cdots$$

OPTIMIZATION SYSTEM

This application is a continuation of application Ser. No. 07/632,288, filed Dec. 21, 1990, now abandoned.

TECHNICAL FIELD OF THE INVENTION

This invention relates in general to the field of electronics systems and more particularly to an improved optimization system.

BACKGROUND OF THE INVENTION

Computerized modeling of electronic devices allows for inexpensive and efficient computerized design of electric circuits and systems. A discrete electronic device such as a bipolar transistor requires a large number of parameters to accurately model its operational characteristics. For example, a typical bipolar transistor using the SPICE modeling system requires on the order of thirty parameters to sufficiently specify its operational characteristics.

Once the parameters of an electronic device have been calculated so that the electronic device can be modeled, computer aided design systems can efficiently design circuits using the electronic device and use the calculated parameters to accurately predict the operational characteristics of the circuit comprising the device. In order to calculate the thirty or so parameters used to model an electronic device such as a bipolar transistor, the device is tested at various points in its operating spectrum to construct a data set of measured data values. A first guess is then made at the values for the modeling parameters of the device. An objective function is then calculated which represents a summation of the error between the measured and calculated parameters for all of the parameters necessary for modeling the device. Using an iterative process, the parameters are changed to minimize the value of the objective function. When the objective function is minimized, the values for the modeling parameters represent the closest approximation of the modeled parameters to the actual measured parameters.

For a variety of reasons, the modeling parameters are given minimum or maximum limiting values. These limiting values aid in the efficient minimization of the objection function as well as embodying certain physical constraints of the devices and their corresponding parameters. In some systems, the minimization of the objective function is slowed considerably when the minimization process crosses one of these arbitrary boundaries. Accordingly, the need has arisen for an optimization system which can react to the presence of an arbitrary maximum or minimum value of a modeling parameter and efficiently proceed with the minimization of the objective function to quickly and efficiently arrive at the correct set of modeling parameters for a given device.

SUMMARY OF THE INVENTION

In accordance with the present invention, a modeling system for generating a computer model of a transistor is provided which comprises circuitry for calculating initial calculated values of operation variables associated with the transistor to be modeled at various operating points using an initial set of modeling parameters. The system of the present invention further comprises memory circuitry operable to store the initial calculated values and empirically measured values of the operating variables for the various operating points of the transistor. Arithmetic circuitry is used to calculate an objective function which is a measure of the error between the calculated values and the empirically measured values. The objective function is first calculated using the first set of modeling parameters. Some of the modeling parameters may have set maximum or minimum values. During the iterative process of minimizing the objective function, the next value for a particular modeling parameter may violate one of these set minimum or maximum values. In this case, according to the teaching of the present invention, the next values for the modeling parameters for the next iteration of the objective function is calculated ignoring the parameter which violated the maximum or minimum condition. In this manner, the minimization of the objective function can be accomplished more efficiently than prior art methods.

According to one embodiment of the present invention, when a minimum value for the objective function has been determined, the final set of modeling parameters used to calculate the minimum value of the objective function can be used to model the transistor. A circuit design system is used to design a circuit comprising transistors having similar operational characteristics to the transistor modeled by the final set of modeling parameters.

According to still another embodiment of the present invention, a transistor testing system is used to empirically measure values for the operating variables associated with the various operating points of the transistor to be modeled by the modeling system.

An important technical advantage of the system of the present invention inheres in the fact that the calculation of the next value for each of the modeling parameters excluding from consideration the modeling parameter which has violated the maximum or minimum limits provides for the efficient minimization of the objective function. According to the teachings of the present invention, the objective function can be minimized using fewer iterations than prior art methods when maximum or minimum values of modeling parameters are violated.

BRIEF DESCRIPTION OF THE DRAWINGS

A more complete understanding of the present invention may be acquired by referring to the detailed description in claims when considered in connection with the accompanying drawings, wherein:

FIG. 1 is a functional block diagram of a modeling and optimization system which may utilize the teachings of the present invention; and FIG. 2 is a mathematical formula illustrating the mathematical terms of an objective function used in prior system which incorporate relative weighting of the terms involved;

FIGS. 3a and 3b are graphical illustrations of operation characteristics of an exemplary device which may be modeled using the teachings of the present invention;

DETAILED DESCRIPTION OF THE INVENTION

Figures 4, 5:
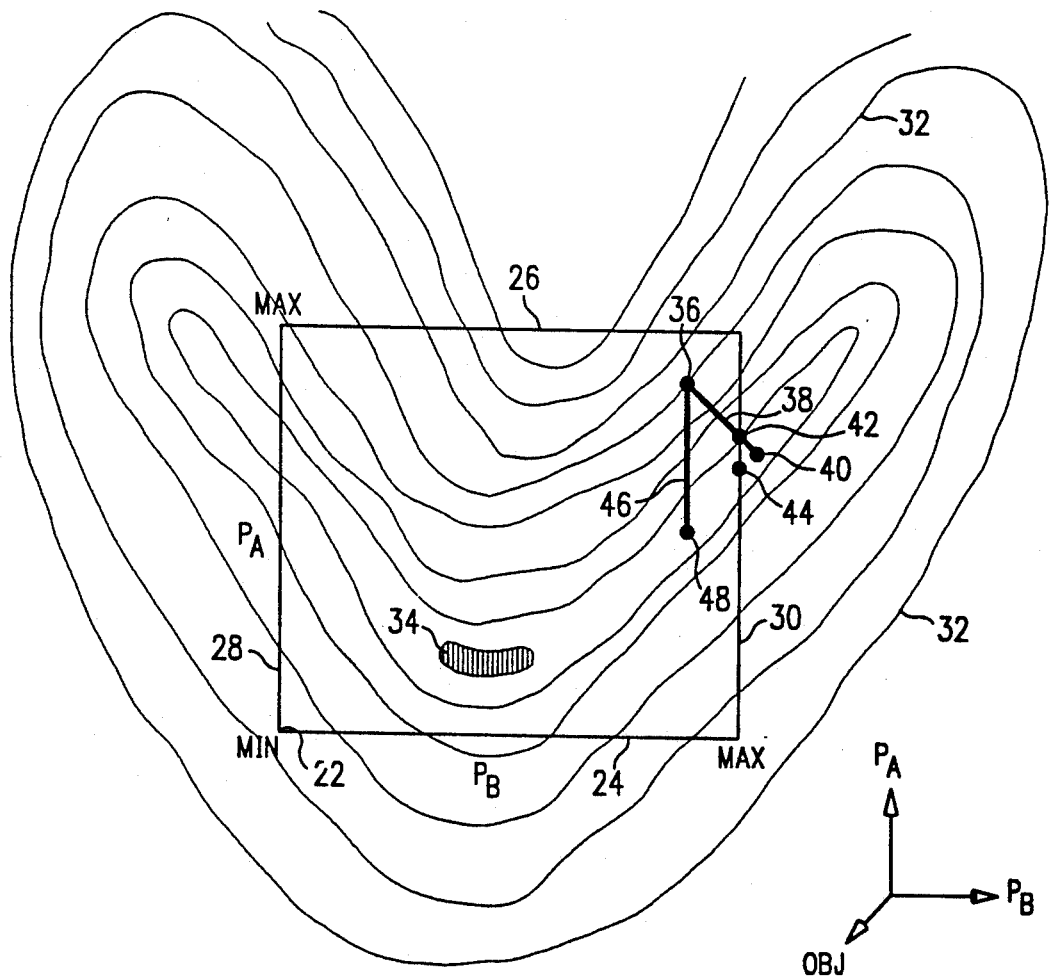
FIG. 4 is a mathematical characterization of a portion of the objective function used in the system of the present invention.
FIG. 5 is a graphic illustration of an objective function comparing prior art methods of minimization to the methods utilized by the system of the present invention.

FIG. 1 illustrates a system 10 which comprises a central processing unit 12. Central processing unit 12 is coupled to a memory circuit 14 through a bi-directional bus. Memory circuit 14 may comprise circuitry for storing programs to be run by central processing unit 12. Memory circuit 14 can also be used to store the data sets used in conjunction with the system of the present invention.

Central processing unit 12 is also coupled through a bi-directional data bus to an arithmetic logic unit 16. Arithmetic logic unit 16 comprises circuitry for performing the arithmetic calculations necessary during the operation of the system of the present invention.

Central processing unit 12 is also coupled to a device testing system 18. The device testing system 18 is operable to acquire the measured values of the operational characteristics of the device to be modeled by system 10. Device testing system 18 may act under the direction of the central processing unit 12 or it may comprise an autonomous system which constructs the measured data set such that central processing unit 12 merely retrieves the data set and stores it in memory 14 such that it may be used in the modeling process. Device testing system 18 may comprise, for example, an HP4145 Semiconductor Parameter Analyzer manufactured by Hewlett Packard, Inc. A circuit design system 21 is coupled to central processing unit 12 such that circuit design system 21 may receive the final values of the modeling parameters and use these parameters to design circuits comprising devices similar to the modeled device. Circuit design system 21 may comprise, for example, a conventional SPICE circuit design software system.

Central processing unit 12 is also coupled to an input and display unit 20. Input and display unit 20 may comprise, for example, a keyboard and a monitor for inputting values into central processor unit 12 and for displaying information from central processing unit 12, respectively.

System 10 may comprise, for example, a main frame computer or workstation coupled to a testing system which may, for example, measure the operational characteristics of a bipolar transistor.

In general, system 10 operates by utilizing device testing system 18 to acquire data regarding the operation of a particular device to be modeled by system 10. For example, device testing system 18 could acquire a large number of data points associated with the output characteristics of a transistor to be modeled by system 10. The central processing unit 12 retrieves the values of the data from device testing system 18 and stores them in memory 14. System 10 is then supplied with a first set of modeling parameters intended to describe the operation of the device to be modeled by system 10. The central processing unit 12 and arithmetic logic unit 16 then calculate theoretical values for the various operating points of the device to be modeled using the modeling parameters. The measured values of the operating points of the device and the theoretical values of the operating points of the device are then compared by calculating an objective function which measures the error between the theoretical and measured values. The calculation of the objective function utilizes various normalization techniques to prevent data values and data sets from overwhelming values of other data during the calculation of the objective function. The calculation of the objective function including these normalization techniques is fully described in applicant's co-pending application entitled "OPTIMIZATION SYSTEM", Ser. No. 632,280, filed on Dec. 21, 1990, the specification of which is hereby incorporated by reference.

A description of the objective function disclosed in the co-pending application (Ser. No. 632,280) is included herein. FIGS. 2 through 4, from the co-pending application, are included to aid in the understanding.

FIG. 2 is a methematical expression which illustrates the structure of the objective function as it was used in prior modeling and optimization systems. The terms D1, D2 and DN refer to the various data points from a device which is to be modeled. The objective function illustrated in FIG. 2 comprises the summation of the error between the measured values of each of the data points and the calculated values of each of the data points. The form of the objective function in FIG. 2 utilizes the relative weighting scheme common in prior systems. This scheme normalizes each point within a particular data set to eliminate problems associated with wide variances in the absolute values of data points within a particular data set.

FIGS. 3a and 3b are graphical illustrations of two operation variables of bi-polar transistors which will be helpful in explaining the problems associated with the prior art objective function as well as the benefits of the objective function used in conjunction with the system of the present invention. FIG. 3a illustrates a graph 122 which is common referred to as a Gummel curve. Graph 122 illustrates the relationship of the collector current, $I_C$, and the base current, $I_B$, to the base emitter voltage, $V_{BE}$. The data set comprising the curve 124 illustrating the collector current $I_C$, can have absolute values ranging on the order of $1e^{-12}$ to absolute values on the order of 0.1. In the case of the Gummel curve 122, each of these data points is equally valuable and equally important to the final modeling of the device. As such, each data point must be normalized during the calculation of the objective function so that the absolute values of the larger values within the data set do not overwhelm the errors introduced in the absolute values of the smaller values within the data set. This normalization is accomplished as shown in FIG. 2 by dividing by the square of the measured value within each of the terms. Accordingly, as each data point is introduced into the summation of the Gummel curve term within the objective function, the calculated value for the data point is subtracted from the measured value for the data point and the difference is squared. The square of the measured value is then divided from this square of the difference to achieve the normalized value for this data point. This calculation is done for each of the data points and each of these normalized values are summed together to achieve a summation value for that particular term. The summation values for each of the terms are then summed together to achieve a total value for the objective function.

The normalization procedure discussed with reference to FIG. 2 used in conjunction with prior systems works very well for data sets which have a wide range of absolute values where all of the data points within the data set are equally important. FIG. 3b illustrates a set of output data associated with a bipolar transistor where these prerequisites are not true.

FIG. 3b is a graphic illustration of the relationship of the collector current, $I_C$, to the collector emitter voltage, $V_{CE}$, as the base current, $I_B$ is varied. This relationship is shown in an output characteristic graph indicated generally at 126 in FIG. 3b. The data set illustrated by output characteristic graph 126 is an excellent example of a data set which does not lend itself well to the normalization procedure used in prior systems. The data set shown in FIG. 3b has a range of absolute values on the order of $1e^{-6}$ to $1e^{-3}$. Because of this relatively narrow range, the normalization procedure described previously is not as necessary as each of the data points within the data set are relatively comparable in terms of magnitude. However, the key consideration in the altering of the calculation of the term within the objective function associated with this data set is that a portion of the data set shown in graph 126 is not critical in the operation of the bipolar transistor to be modeled and is not modeled well using modeling parameters. This range of data values is indicated generally at 128 on graph 126 and comprises the data values having the smaller magnitudes within the data set shown in graph 126. The device whose characteristics are illustrated in graph 126 usually operates in the operational realm characterized by the remainder of the graph 126 excluding portion 128. As such, a restructuring of the objective function which minimizes the influence of the data points within portion 128 is appropriate. This restructuring is accomplished by not normalizing the data set illustrated in graph 126 on a point by point basis. Specifically, this is accomplished by not dividing by the measured value but merely squaring the difference between the calculated and measured value and then summing this difference of squares. This is referred to as "absolute weighting" of the data points within a data set. A data set which is normalized on a point by point basis is deemed to be subjected to "relative weighting".

Absolute weighting of a data set provides that the data points having the large absolute values will be given more weight in the calculation of the objective function than the data points having smaller absolute values. For certain data sets, giving the larger values more weight is appropriate and allows for more accurate modeling of the device. A problem occurs, however, when a term within the objective function which has been subjected to relative waiting is to be summed with a term which has been subjected to absolute weighting. A second normalization procedure illustrated in FIG. 4 solves this problem. Referring to FIG. 4, a term 130 illustrates the calculations associated with the collector current which is subjected to relative weighting. Further, a term 132 illustrates the calculations associated with the collector current, $I_C$, which is subjected to absolute weighting for the reasons discussed previously. The remaining terms within the actual objective function have been omitted for purposes of clarity. However, it should be understood that there could be literally dozens of operating variables which are affected by the thirty or so SPICE constants and which would be included in the calculation of any particular objective function. Referring to term 130, the error between the measured and calculated values of a particular data point in a first collector current data set is calculated and squared. The square of the measured valued for the collector current is then divided from this squared difference. This term thus comprises a relatively weighted normalized term which is comparable to a percentage error of the measured value versus the calculated value. Referring now to term 132, the calculated value of the collector current is subtracted from the measured value for the collector current at each particular data point within the second collector current data set. This difference is then squared. This value essentially comprises an absolute error between the measured and calculated values of the collector current for a particular data point within the second collector current data set. In order that the absolute error and the relative error may be compared without one of the terms dominating the other term because of a much larger absolute value, each objective function value associated with a data set is divided by the initial value of the objective function for that data set. These calculations are repeated for each data set. This second normalization step effectively normalizes each of the individual objective function values associated with each term relative to one another. Accordingly, the terms can be added to get a total objective function for the system with each term receiving equal weight. In operation, the initial value for each of the terms within the objective function such as, for example, the denominators of terms 130 and 132 shown in FIG. 4 are stored in memory so that they may be used in later iterations of the objective function. The relative error terms for the first collector current data sets are then summed together to get a total relative error. Similarly, the absolute errors for the second collector current data set are summed to get a total absolute error. The total error values are then summed to yield a total value for the objective function for a particular iteration.

The objective function is then iteratively run through optimization routines using known methods such as those described herein. With each iteration, the modeling parameters are varied and new values for the various operation variables of the device are calculated. The objective function is then calculated using the formula shown in FIG. 4. Using optimization methods the total value of the objective function is thus minimized and the values for the modeling parameters of the final iteration may then be used to model the particular device. The modeled device can then be used by a circuit design system such as system 21 to design circuitry incorporating devices similar to the modeled device.

Referring to FIG. 4, terms 130 and 132 are calculated in each iteration by calculating for each data set the quotient of an error function for that data set on that iteration divided by the same error function for that data set for the first iteration and summing these quotients. For the first iteration, this procedure results in the value of the objective function shown in FIG. 4 always being equal to the number of data sets (N).

As described previously, the objective function is a measure of the error between the theoretical values calculated using the modeling parameters and the actual operation of the device to be modeled. As such, if a minimum value of the objective function can be found, the modeling parameters used to calculate the minimum value of the objective function will represent the best model of the operation of the device.

In a SPICE model of a device, for example, a bipolar transistor, there are on the order of thirty parameters which are used to model the operational characteristics of the device. Some of these modeling parameters have minimum and maximum values which may be used to constrain the optimization routines. For example, certain parameters must have positive values in order to accurately model the physical operation of a device.

Hence, if a minimization routine of an objective function attempts to give a value to a parameter which is outside the minimum or maximum values for that parameter, the system should recognize that the indicated value for the parameter is in error. Prior art systems dealt with constraints in the modeling parameters in an inefficient manner.

FIG. 5 is a graphical illustration which illustrates the inefficient processes used by prior art minimization systems and the more efficient process used by the system of the present invention. Referring to FIG. 5, a contour plot of an objective function is illustrated. In FIG. 5, the horizontal direction indicates values of a parameter "B" ($P_B$). The vertical direction of FIG. 5 indicates values of a parameter "A" ($P_A$). A point 22 indicated in FIG. 5 corresponds to the intersection of a minimum value associated with parameter A and a minimum value associated with parameter B. A line 24 indicates a minimum boundary for parameter A while a line 26 indicates a maximum boundary for parameter A. Similarly, a line 28 indicates a minimum value for parameter B, while a line 30 indicates a maximum boundary for parameter B. Contour lines 32 indicate progressively decreasing values of the objective function calculated using parameter A and parameter B. The contour of the objective function shown in FIG. 2 illustrates a minimum value which is indicated at 34. Accordingly, the plot indicated in FIG. 5 is intended to illustrate a generally U-shaped "valley" with a low point at point 34.

It should be understood that for purposes of teaching the system of the present invention, the minimization procedure is greatly simplified in FIG. 5. FIG. 5 illustrates an objective function which is a function of merely two parameters A and B. As described previously, an actual objective function could be a function of as many as thirty parameters or more. There is, of course, no way to graphically plot a thirty dimension function. Accordingly, for purposes of teaching the present invention, FIG. 5 has been limited to a three-dimensional representation of the minimization procedure of an objective function which is a function of a first parameter B shown in the horizontal direction and a second parameter A shown in the vertical direction.

In operation, the minimization procedure begins with a first guess point 36. First guess point 36 corresponds as described previously to a value of the objective function associated with the first guesses for the parameters. The first values for the parameters are then used to calculate values of various operating variables associated with the operation of the device to be modeled. The calculated value of these operating variables are then compared to the measured values and the value for the objective function corresponding to point 36 is determined. The minimization operation proceeds by calculating the Jacobian of the objective function using known methods. Essentially, the Jacobian gives the gradient of the objective function and results in a vector 38 which indicates the direction and magnitude to the next guess point, which is indicated at 40 in FIG. 5.

As can be seen in FIG. 5, point 40 is much closer to the minimum value for the objective function 34 than was point 36. However, point 40 is clearly greater than the maximum value allowed for parameter B as vector 38 has crossed maximum line 30. Prior art systems would recognize that a parameter such as parameter B was out of bounds in these circumstances and would truncate vector 38 back to a point 42 indicated in FIG. 5. Point 42 would then be used as the next guess and the minimization operation would continue. Unfortunately, due to the shape of the objective function shown in FIG. 5, the next guess from point 42 would also be out of bounds across maximum line 30. As a result, the prior art systems would result in a "hem-stitching" operation comprising repeated "out of bounds" guesses and subsequent vector truncation until finally a point 44 was reached. From point 44, the vector for the next guess calculated from the gradient of the objective function would finally go in the direction of the minimum 34.

Using the teachings of the present invention, these multiple hem-stitching iterations are avoided. Referring again to FIG. 5, when the initial vector 38 is calculated to result in the next guess point 40 being across the maximum line 30, the system of the present invention will not proceed to point 42, but will recalculate the next guess vector. During the recalculation of the vector, the parameter which was out of bounds, parameter B in this case, will be ignored. This results in the calculation of a new vector 46, which remain constant in the "B" dimension and, as such, travels parallel to maximum line 30 to a point 48. The next calculation of the gradient function of the objective function from point 48 will proceed directly to minimum point 34. Accordingly, by ignoring the parameter B in the calculation of the Jacobian of the objective function during the recalculation of the next guess vector, the multiple iterations of the prior art hem-stitching operation are avoided.

In the example shown in FIG. 5, on the order of three or four iterations are saved through the use of the system of the present invention. As described previously, FIG. 5 is a simplification of the actual calculation of the objective function and the minimization operation. In an actual case, the large number of parameters having minimum or maximum constraints greatly exacerbates the problem solved by the system of the present invention. In an actual minimization operation, many more iterations can be saved through the use of the system and methods of the present invention. Additionally, because of the complexity of an actual minimization process, previous methods and systems may never arrive at the correct minimum value when a limiting constraint is encountered.

In summary, an optimization system and method have been described which is much more efficient than prior art systems in dealing with modeling parameters which are subject to arbitrary constraints. The system of the present invention, when presented with a next guess point during the minimization operation which is impossible due to one of the modeling parameter constraints, recalculates the next guess point ignoring the parameter which was out of bounds. This procedure eliminates the multiple iterations involved with the hem-stitching operation of prior art systems. In a large optimization operation, this can save many iterations, resulting in a much more efficient modeling system and method.

Although the present invention has been described in detail, it should be understood that various changes, substitutions and alterations can be made hereto without departing from the spirit and scope of the invention as defined by the appended claims.

What is claimed is:

1. A modeling system operable for generating a computer model of a transistor comprising a plurality of modeling parameters given a plurality of measured values of operating variables associated with various operating points of the transistor to be modeled by the modeling system, certain ones of said plurality of modeling parameters having constraints associated with final values for said certain ones of the parameters, the system comprising:
  calculation circuitry operable for calculating initial calculated values of the operating variables at the various operating points using an initial set of modeling parameters such that for each of the operating points there is a measured value and initial calculated value;
  memory circuitry operable for storing said initial calculated values and the measured values;
  said calculation circuitry operable for calculating an initial objective function as a measure of the error between said calculated values and the measured values;
  said calculation circuitry operable for calculating a next set of modeling parameters from said objective function;
  said calculation circuitry operable for determining if any particular parameters within said next set of modeling parameters violates a constraint associated with said particular parameter; and
  said calculation circuitry, responsive to said circuitry for calculating a new set of modeling parameters if any particular parameter violates a constraint associated with said parameter, said new set of modeling parameters calculated by ignoring said particular parameter.

2. The system of claim 1 wherein said circuitry for calculating a next set of modeling parameters comprises circuitry for calculating the gradient of said objective function.

3. The system of claim 1 wherein said circuitry for calculating a new next set of modeling parameters comprises circuitry for calculating the gradient of said objective function ignoring a term associated with said particular parameter such that said particular parameter will have the same value in said new next set of modeling parameters as in said initial set of modeling parameters.

4. The system of claim 1 and further comprising a transistor testing system operable to measure the measured values of operating variables associated with various operating points of a transistor to be modeled by the modeling system.

5. The system of claim 1 wherein said calculation circuitry comprises a central processing unit and an arithmetic logic unit coupled together by a bus.

6. The system of claim 1 and further comprising circuitry for determining a minimum value of said objective function, a model of said transistor comprising a final set of modeling parameters used to calculate said minimum value.

7. The system of claim 6 wherein said transistor comprises a test transistor and further comprising a circuit design system operable to use said final set of parameters to design a circuit comprising circuit transistors having similar operational characteristics as said test transistor.

8. A modeling system operable for generating a computer model of a test transistor comprising a plurality of modeling parameters given a plurality of measured values of operating variables associated with various operating points of the transistor to be modeled by the modeling system, certain ones of the plurality of modeling parameters having constraints associated with final values for the certain ones of the parameters, the system comprising:
  a transistor testing system operable to measure the measured values of operating variables associated with various operating points to the test transistor to be modeled by the modeling system;
  calculation circuitry operable for calculating initial calculated values of the operating variables at the various operating points using an initial set of modeling parameters such that for each of the operating points there is a measured value and initial calculated value;
  memory circuit for storing said initial calculated values and the measured values;
  said calculation circuitry operable for calculating an initial objective function as a measure of the error between said calculated values and the measured values;
  said calculation circuitry operable for calculating a next set of modeling parameters from said objective function by calculating the gradient of said objective function;
  said calculation circuitry operable for determining if any particular parameters within said next set of modeling parameters violates a constraint associated with said particular parameter;
  said calculation circuitry, responsive to said determining, operable for calculating a new set next set of modeling parameters if any particular parameter violates a constraint associated with said parameter, said new next set of modeling parameters calculated by calculating the gradient of said objective function ignoring a term associated with said particular parameter such that said particular parameter will have the same value in said new next set of modeling parameters as in said initial set of modeling parameters;
  said calculation circuitry operable for determining a minimum value of said objective function, a model of said transistor comprising a final set of modeling parameters used to calculate said minimum value; and
  a circuit design system operable to use said final set of parameters to design a circuit comprising circuit transistors having similar operational characteristics as said test transistor.

9. A modeling system operable for generating a computer model of a transistor comprising a plurality of modeling parameters given a plurality of measured values of operating variables associated with various operating points of the transistor to be modeled by the modeling system, certain ones of said plurality of modeling parameters having constrains associated with final values for said certain ones of the parameters, the system comprising:
  computing means for calculating initial calculated values of the operating variables at the various operating points using an initial set of modeling parameters such that for each of the operating points there is a measured value and initial calculated value;
  a memory circuit for storing said initial calculated values and the measured values;
  said computing means for calculating an initial objective function as a measure of the error between said calculated values and the measured values;
  said computing means for calculating a next set of modeling parameters from said objective function;

said computing means for determining if any particular parameter within said next set of modeling parameters violates a constraint associated with said particular parameter; and said computing means, responsive to said circuitry for calculating a new set of modeling parameters if any particular parameter violates a constrain associated with said parameter, said new next set of modeling parameters calculated by ignoring said particular parameter.

10. The system of claim 9 wherein said means for calculating comprises an arithmetic logic unit.

* * * * *